(12) United States Patent
Fukuoka

(10) Patent No.: US 9,762,140 B2
(45) Date of Patent: Sep. 12, 2017

(54) SEMICONDUCTOR DEVICE

(71) Applicant: DENSO CORPORATION, Kariya, Aichi-pref. (JP)

(72) Inventor: Daisuke Fukuoka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/149,240

(22) Filed: May 9, 2016

(65) Prior Publication Data
US 2016/0336251 A1 Nov. 17, 2016

(30) Foreign Application Priority Data

May 11, 2015 (JP) .................................. 2015-96492

(51) Int. Cl.
| | |
|---|---|
| *H01L 23/10* | (2006.01) |
| *H02M 7/44* | (2006.01) |
| *H01L 29/739* | (2006.01) |
| *H01L 29/861* | (2006.01) |
| *H01L 29/16* | (2006.01) |
| *H01L 27/06* | (2006.01) |
| *H01L 23/051* | (2006.01) |
| *H01L 23/433* | (2006.01) |
| *H01L 23/495* | (2006.01) |
| *H01L 23/31* | (2006.01) |
| *H01L 23/373* | (2006.01) |

(52) U.S. Cl.
CPC ............ *H02M 7/44* (2013.01); *H01L 23/051* (2013.01); *H01L 23/4334* (2013.01); *H01L 23/49513* (2013.01); *H01L 23/49541* (2013.01); *H01L 23/49548* (2013.01); *H01L 23/49568* (2013.01); *H01L 27/0664* (2013.01); *H01L 29/16* (2013.01); *H01L 29/1608* (2013.01); *H01L 29/7395* (2013.01); *H01L 29/861* (2013.01); *H01L 23/3107* (2013.01); *H01L 23/3735* (2013.01); *H01L 2224/33* (2013.01); *H01L 2224/40245* (2013.01); *H01L 2924/181* (2013.01)

(58) Field of Classification Search
CPC ............ H01L 23/051; H01L 23/49513; H01L 23/49541; H01L 23/49568
USPC ....................................................... 257/707
See application file for complete search history.

(56) References Cited

U.S. PATENT DOCUMENTS

| 5,001,545 A | * | 3/1991 | Kalfus | ............... H01L 23/49562 257/773 |
| 6,040,626 A | * | 3/2000 | Cheah | ............... H01L 23/49562 257/341 |

(Continued)

FOREIGN PATENT DOCUMENTS

| JP | 2002-026195 A | 1/2002 |
| JP | 2008-198718 A | 8/2008 |

(Continued)

*Primary Examiner* — Nitin Parekh
(74) *Attorney, Agent, or Firm* — Posz Law Group, PLC

(57) ABSTRACT

A semiconductor device includes a semiconductor chip, a metal member, and a terminal. The semiconductor chip has an electrode. The metal member is electrically connected to the electrode. The terminal extends from the metal member to be connected to an external connection member. The terminal has a width-increased portion in a predetermined area beginning from a first end of the terminal that connects to the metal member.

18 Claims, 3 Drawing Sheets

(56) References Cited

U.S. PATENT DOCUMENTS

| | | | | |
|---|---|---|---|---|
| 6,255,672 B1* | 7/2001 | Yoshioka | ............. | H01L 25/072 257/107 |
| 6,256,200 B1* | 7/2001 | Lam | ........................ | H01L 24/84 257/669 |
| 6,459,147 B1* | 10/2002 | Crowley | ........... | H01L 23/49524 257/666 |
| 6,479,888 B1* | 11/2002 | Hirashima | ............ | H01L 21/561 257/666 |
| 6,703,707 B1* | 3/2004 | Mamitsu | ............... | H01L 23/051 257/713 |
| 2004/0080028 A1* | 4/2004 | Yanagisawa | ........ | H01L 23/3107 257/675 |
| 2005/0127483 A1* | 6/2005 | Joshi | ..................... | H01L 23/495 257/676 |
| 2014/0027891 A1* | 1/2014 | Kimura | ............... | H01L 23/3107 257/675 |

FOREIGN PATENT DOCUMENTS

| | | |
|---|---|---|
| JP | 2010-118712 A | 5/2010 |
| JP | 2012-235081 A | 11/2012 |

* cited by examiner

SEMICONDUCTOR DEVICE

CROSS REFERENCE TO RELATED APPLICATION

This application is based on Japanese Patent Application No. 2015-96492 filed on May 11, 2015, the disclosure of which is incorporated herein by reference.

TECHNICAL FIELD

The present disclosure relates to a semiconductor device that includes a semiconductor chip, a metal member electrically connected to an electrode of the semiconductor chip, and a terminal extending from the metal member to be connected to an external connection member.

BACKGROUND

For example, JP 2012-235081 A discloses a semiconductor device that includes a semiconductor element as a semiconductor chip, a thick plate portion as a metal member electrically connected to an electrode of the semiconductor chip, and terminals, such as a high-potential power source terminal, a low-potential power source terminal and an output terminal, to be connected to external connection members.

In such a semiconductor device, the terminals extend from the metal member with predetermined widths, such as constant widths. The terminals having constant widths are likely to be vibrated due to external vibrations transmitted through the connecting members. In such a case, the base portions of the terminals are stressed. As a result, reliability in connection of the terminals degrades.

In regard to an electric current path between the metal member and the terminal, the width of the electric current path largely changes in the vicinity of the base portion, and thus the current density increases. The concentration of currents results in an increase in inductance.

SUMMARY

It is an object of the present disclosure to provide a semiconductor device that is capable of restricting vibrations of a terminal and concentration of currents.

According to an aspect of the present disclosure, a semiconductor device includes a semiconductor chip, a metal member, and a terminal. The semiconductor chip has an electrode. The metal member is electrically connected to the electrode. The terminal extends from the metal member to be connected to an external connection member. The terminal has a width-increased portion in a predetermined area beginning from a first end of the terminal that is adjacent to the metal member.

In the semiconductor device, the terminal has the width-increased portion adjacent to the first end connecting to the metal member, and thus a base portion of the terminal connecting to the metal member is reinforced. Therefore, the terminal is restricted from being vibrated due to vibrations transmitted from an external device.

In the terminal having the width-increased portion, a change of width of a current path between the terminal and the metal member is smaller than that in a terminal without having the width-increased portion. Therefore, current concentration at the first end of the terminal can be reduced. Accordingly, the vibrations of the terminal and the current concentration in the terminal can be restricted.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, embodiments of the present disclosure will be described with reference to the drawings.

In the following descriptions, like or equivalent components will be designated by like reference numbers. In the following descriptions, a thickness direction in which a thickness of a semiconductor chip is measured will be referred to as a Z direction. A direction that is perpendicular to the Z direction and in which a semiconductor chip of an upper arm and a semiconductor chip of a lower arm are arranged will be referred to as an X direction, and will also be referred to as an arrangement direction. The X direction corresponds to a direction that is perpendicular to the thickness direction. A direction that is perpendicular to the Z direction and the X direction will be referred to as a Y direction. A plane including the X direction and the Y direction will be referred to as an XY plane, and is perpendicular to the Z direction. The shape along the XY plane will be referred to as a plane shape.

First Embodiment

Figure 1:
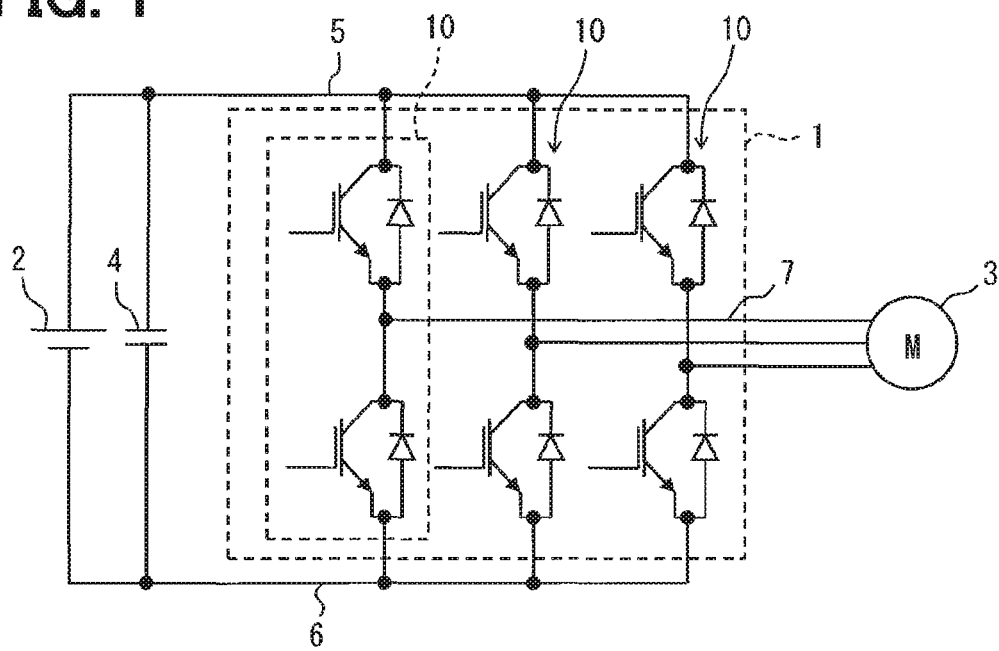
FIG. 1 is a schematic circuit diagram of a power conversion apparatus to which a semiconductor device according to a first embodiment of the present disclosure is applied.

Firstly, an example of a power conversion apparatus employing a semiconductor device will be described with reference to FIG. 1.

A power conversion device 1 is configured to convert a direct current voltage supplied from a direct current source 2 into three phase alternating currents, and to output the three-phase alternating currents to a three-phase alternating current motor 3. The power conversion apparatus 1 is, for example, installed in an electric vehicle or a hybrid vehicle. The power conversion apparatus 1 can convert an electric power generated from the motor 3 into a direct current, and charge the direct current to the direct current source 2 (battery). Therefore, the motor 3 can be also referred to as a motor generator. In FIG. 1, a reference numeral 4 denotes a smoothing capacitor.

The power conversion apparatus 1 includes a three-phase inverter. The three-phase inverter has upper arms and lower arms for three phases, between a high-potential power source line 5 connected to a positive terminal of the direct current source 2 and a low-potential power source line 6 connected to a low potential terminal of the direct current source 2. The upper arm and the lower arm constituting each phase are provided by a semiconductor device 10.

The semiconductor device 10 includes insulated gate bipolar transistors (hereinafter referred to as IGBTs) and freewheel diodes (hereinafter referred to as FWDs) connected to the respective IGBTs in anti-parallel. In the present embodiment, the IGBTs and FWDs are formed in semiconductor chips 11. As another example, the IGBT and the FWD may be formed in separate chips. In the present embodiment, the IGBT is an n-channel type. A cathode electrode of the FWD is connected in common with a collector electrode. An anode electrode of the FWD is connected in common with an emitter electrode.

In the semiconductor device 10, the collector electrode of the IGBT of the upper arm is electrically connected to the high-potential power source line 5, and the emitter electrode of the IGBT of the upper arm is connected to an output line 7 connecting to the motor 3. The collector electrode of the IGBT of the lower arm is connected to the output line 7, and the emitter electrode of the IGBT of the lower arm is electrically connected to the low-potential power source line 6.

In addition to the three-phase inverter, the power conversion apparatus 1 may include a boosting converter for boosting the direct current voltage supplied from the direct current source 2, and a controller for controlling operations of switching elements of the three-phase inverter and the boosting converter.

Next, a schematic structure of the semiconductor device 10 will be described with reference to FIGS. 2 to 4. In FIG. 3, an encapsulating resin body is not illustrated.

Figure 2:
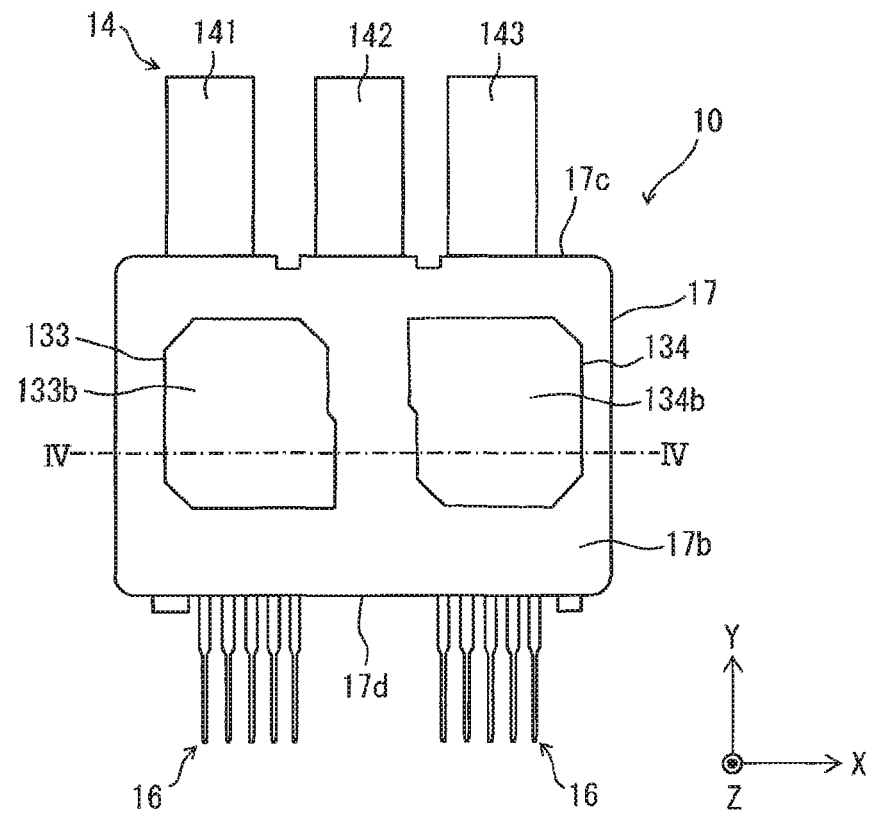
FIG. 2 is a schematic plan view of the semiconductor device according to the first embodiment.
Figure 3:
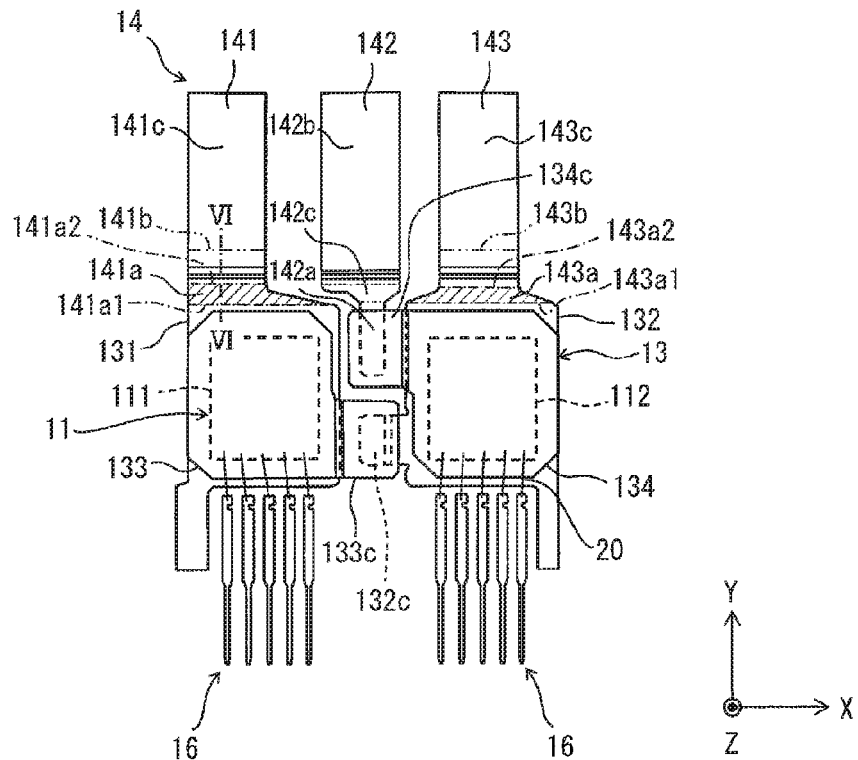
FIG. 3 is a plan view of the semiconductor device, without having an encapsulating resin body, according to the first embodiment.
Figure 4:
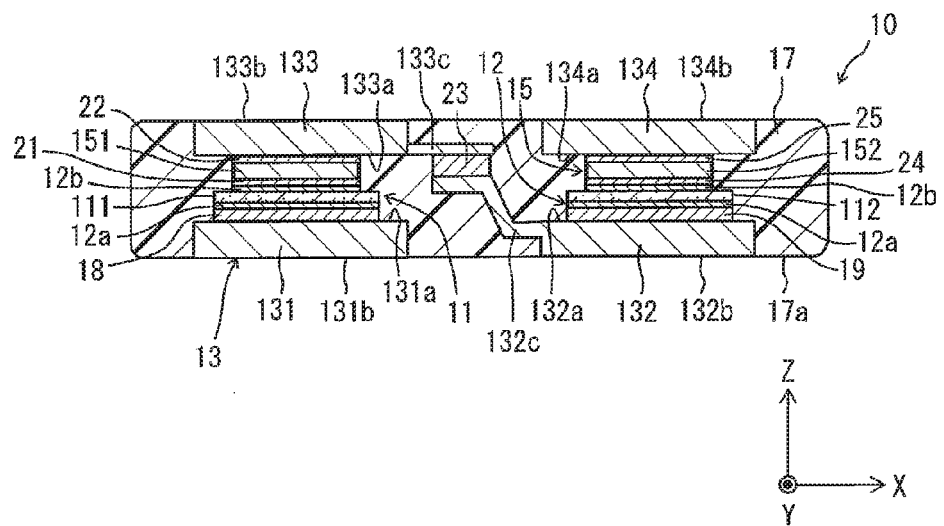
FIG. 4 is a cross-sectional view taken along a line IV-IV in FIG. 2.

As shown in FIGS. 2 to 4, the semiconductor device 10 includes semiconductor chips 11 having electrodes 12, heat sinks 13 electrically connected to the electrodes 12, main terminals 14 extending from the heat sinks 13 to be electrically connected to external connection members. As the main terminals 14, the semiconductor device 10 includes a high-potential power supply terminal 141 connected to the high-potential power source line 5, a low-potential power supply terminal 142 connected to the low-potential power source line 6, and an output terminal 143 connected to the output line 7. Hereinafter, the high-potential power supply terminal 141 will also be referred to as a P-terminal 141. Likewise, the low-potential power supply terminal 142 will also be referred to as an N-terminal 142, and the output terminal 143 will also be referred to as an O-terminal 143. The main terminals 14 correspond to terminals. Of the main terminals 14, the P-terminal 141 and the O-terminal 143 correspond to terminals having width-increased portions. Further, P-terminal 141 corresponds to a first main terminal, the O-terminal 143 corresponds to a second main terminal, and the N-terminal 142 corresponds to a third main terminal.

The semiconductor device 10 further includes terminals 15, signal terminals 16 and an encapsulating resin body 17. The terminals 15 are disposed between the heat sinks 13 and the semiconductor chips 11. The terminals 15 electrically and thermally connect between the heat sinks 13 and the semiconductor chips 11. The encapsulating resin body 17 encapsulates the semiconductor chips 11 therein. As the semiconductor chips 11, the semiconductor device 10 includes a semiconductor chip 111 of the upper arm, and a semiconductor chip 112 of the lower arm. As the terminals 15, the semiconductor device 10 includes a terminal 151 corresponding to the semiconductor chip 111 and a terminal 152 corresponding to the semiconductor chip 112.

As the main terminals 14, the semiconductor device 10 includes the high-potential power supply terminal 141 connected to the high-potential power source line 5, the low-potential power supply terminal 142 connected to the low-potential power source line 6, and the output terminal 143 connected to the output line 7. Hereinafter, the high-potential power supply terminal 141 is also referred to as the P-terminal 141. Likewise, the low-potential power supply terminal 142 is also referred to as the N-terminal 142, and the output terminal 143 is also referred to as the O-terminal 143.

The semiconductor chip 11 includes a semiconductor substrate made of silicon (Si) or silicon carbide (SiC), and an IGBT and a FWD formed on the semiconductor substrate. The FWD is connected to the IGBT in anti-parallel. That is, the semiconductor chip 11 is formed with an RC (reverse conducting)-IGBT. The IGBT and the FWD have a so-called vertical structure that allows an electric current to flow in the thickness direction of the semiconductor chip 11, that is, in the Z direction. As the electrodes 12, the semiconductor chip 11 has a collector electrode 12a on one surface and an emitter electrode 12b on another surface (rear surface) opposite to the one surface on which the collector electrode 12a is disposed with respect to the thickness direction (Z direction). The collector electrode 12a is formed in almost the entirety of the surface of the semiconductor chip 11. The emitter electrode 12b is formed in an active region of the rear surface of the semiconductor chip 11. A plurality of pads are provided on a peripheral region different from the active region on the rear surface of the semiconductor chip 11. The pads include a pad that is electrically connected to the gate electrode.

As the semiconductor chips 11, the semiconductor device 10 includes the semiconductor chip 111 of the upper arm and the semiconductor chip 112 of the lower arm. Each of the semiconductor ships 111, 112 is formed with the IGBT and the FWD. The semiconductor chip 111 corresponds to a first semiconductor chip, and the semiconductor chip 112 corresponds to a second semiconductor chip 112. The semiconductor chips 111, 112 have substantially the same planar shape, such as rectangular shape, and substantially the same size and thickness. The semiconductor chip 111 and the semiconductor chip 112 are arranged so that the respective collector electrodes 12 are oriented in the same direction, with respect to the Z direction, that is, the respective collector electrodes 12 are disposed on the same side with respect to the Z direction. Further, the semiconductor chip 111 and the semiconductor chip 112 are located at substantially the same height in the Z direction, and are arranged side by side in the X direction.

The heat sinks 13 are electrically connected to the electrodes 12 of the respective semiconductor chips 11. The heat sinks 13 function as wirings to electrically connect the semiconductor chips 11 to external devices. The heat sinks 13 also function to dissipate heat generated from the semiconductor chips 11 to outside of the semiconductor device 10. Therefore, the heat sinks 13 are made of a metal material, such as copper, having thermal conductivity and electric conductivity. The heat sinks 13 correspond to a metal member.

As the heat sinks 13, the semiconductor device 10 includes heat sinks 131, 132 disposed adjacent to the collector electrodes 12a of the semiconductor chips 11, and heat sinks 133, 134 disposed adjacent to the emitter electrodes 12b of the semiconductor chips 11. In particular, the heat sink 131 is disposed adjacent to the collector electrode 12a of the semiconductor chip 111, and the heat sink 133 is disposed adjacent to the emitter electrode 12b of the semiconductor chip 111. In this case, the heat sink 131 corresponds to a first heat sink and the heat sink 133 corresponds to a second heat sink. Likewise, the heat sink 132 is disposed adjacent to the collector electrode 12a of the semiconductor chip 112, and the heat sink 134 is disposed adjacent to the emitter electrode 12b of the semiconductor chip 112. In this case, the heat sink 132 corresponds to a third heat sink, and the heat sink 134 corresponds to a fourth heat sink. Each of the heat sinks 13, such as the first to fourth heat sinks 131, 132, 133 and 134, has a rectangular shape in a plan view.

The heat sink 131, which is disposed adjacent to the collector electrode 12a of the semiconductor chip 111, is arranged to encompass the semiconductor chip 111 (collector electrode 12a) in a view projected in the Z direction. A solder 18 is disposed between a surface 131a of the heat sink 131 and the collector electrode 12a of the semiconductor chip 111. The solder 18 electrically and thermally connects the heat sink 131 and the collector electrode 12a of the semiconductor chip 111. The encapsulating resin body 17 has a first surface 17a and a second surface (rear surface) 17b opposite to the first surface 17a with respect to the Z direction. The heat sink 131 has a surface 131a adjacent to the semiconductor chip 111, and a heat radiation surface 131b opposite to the surface 131a. The heat radiation surface 131b of the heat sink 131 exposes from the first surface 17a of the encapsulating resin body 17. The heat radiation surface 131b is substantially coplanar with the first surface 17a.

As shown in FIG. 3, the P terminal 141 connects to the heat sink 131. That is, the P terminal 141 is electrically connected to the heat sink 131. The P terminal 141 may be integrally formed with the heat sink 131. Alternatively, the P terminal 141 and the heat sink 131 may be made of different parts, and connected to each other. In the present embodiment, the P terminal 141 is integrally formed with the heat sink 131. The P terminal 141 has a thickness smaller than that of the heat sink 131. The P terminal 141 extends from one of side surfaces of the heat sink 131 in the Y direction. As shown in FIG. 2, the P terminal 141 projects outside of the encapsulating resin body 17 from a side surface 17c of the encapsulating resin body 17.

The heat sink 131 and the heat sink 132 are arranged in the X direction. The heat sink 132 is disposed adjacent to the collector electrode 12a of the semiconductor chip 112. The heat sink 132 is arranged to encompass the semiconductor chip 112 (collector electrode 12a) in a view projected in the Z direction. A solder 19 is disposed between a surface 132a of the heat sink 132 and the collector electrode 12a of the semiconductor chip 112. The solder 19 electrically and thermally connects the heat sink 132 and the collector electrode 12a of the semiconductor chip 112. The heat sink 132 has a surface 132a adjacent to the semiconductor chip 112, and a heat radiation surface 132b opposite to the surface 132a. The heat radiation surface 132b exposes from the first surface 17a of the encapsulating resin body 17. The heat radiation surface 132b is also substantially coplanar with the first surface 17a of the encapsulating resin body 17.

As shown in FIG. 3 and FIG. 4, the heat sink 132 has a joint portion 132c. The joint portion 132c has a thickness smaller than that of the other part (body part) of the heat sink 132. The joint portion 132c extends from one of side surfaces of the heat sink 132 toward the heat sink 133. The joint portion 132c has two bent portions.

As shown in FIG. 3, the O terminal 143 connects to the heat sink 132. That is, the O terminal 143 is electrically connected to the heat sink 132. The O terminal 143 may be integrally formed with the heat sink 132. Alternatively, the O terminal 143 and the heat sink 132 may be made of different parts, and connected to each other. In the present embodiment, the O terminal 143 is integrally formed with the heat sink 132. The O terminal 143 has a thickness smaller than that of the heat sink 132. The O terminal 143 extends from one of side surfaces of the heat sink 132 in the Y direction. As shown in FIG. 2, the O terminal 143 projects from the side surface 17c of the encapsulating resin body 17, which is the same side surface from which the P terminal 141 projects, to the outside of the encapsulating resin body 17.

The heat sink 133 is disposed adjacent to the emitter electrode 12b of the semiconductor chip 111. The heat sink 133 is arranged to encompass the semiconductor chip 111 in a view projected in the Z direction. The terminal 151 is disposed between a surface 133a of the heat sink 133 adjacent to the semiconductor chip 111 and the emitter electrode 12b of the semiconductor chip 111. The terminal 151 ensures the height necessary for connecting the signal terminals 16 and the pads of the semiconductor chip 111 through bonding wires 20. The terminal 151 is made of a material including at least a metal material to have electric conductivity and thermal conductivity. The terminal 151 electrically and thermally connects the emitter electrode 12b of the semiconductor chip 111 and the heat sink 133. The terminal 151 is disposed to oppose the emitter electrode 12b of the semiconductor chip 111 and is electrically connected to the emitter electrode 12b through a solder 21.

The heat sink 133 is arranged so that the most part of the heat sink 133 overlaps the heat sink 133 when projected in the Z direction. The heat sink 133 is arranged to oppose the surface of the terminal 151 opposite to the semiconductor chip 111. The surface 133a of the heat sink 133 is electrically connected to the terminal 151 through a solder 22. The heat sink 133 has a heat radiation surface 133b opposite to the surface 133a adjacent to the terminal 151. The heat radiation surface 133b exposes from the second surface 17b of the encapsulating resin body 17. The heat radiation surface 133b is substantially coplanar with the second surface 17b.

As shown in FIG. 3 and FIG. 4, the heat sink 133 has a joint portion 133c. The joint portion 133c has a thickness smaller than that of the other part (body part) of the heat sink 133. The joint portion 133c extends from one of side surfaces of the heat sink 133 toward the heat sink 134 in the X direction. A tip end portion of the joint 133c and a tip end portion of the joint 132c are opposed to each other in the Z direction and are electrically connected to each other through a solder 23.

The heat sink 134 is disposed adjacent to the emitter electrode 12b of the semiconductor chip 112. The heat sink 134 is arranged to encompass the semiconductor chip 112 in a view projected in the Z direction. The terminal 152 is disposed between a surface 134a of the heat sink 134 adjacent to the semiconductor chip 112 and the emitter electrode 12b of the semiconductor chip 112. The terminal 152 ensures the height necessary for connecting the signal terminals 16 and the pads of the semiconductor chip 112 through the bonding wires 20. The terminal 152 is made of a material including at least a metal material to have electric conductivity and thermal conductivity. The terminal 152 electrically and thermally connects between the emitter electrode 12b of the semiconductor chip 112 and the heat sink 134. The terminal 152 is disposed to oppose the emitter electrode 12b of the semiconductor chip 112. The terminal 152 is electrically connected to the emitter electrode 12b through a solder 24.

The heat sink 134 is arranged so that the most part of the heat sink 134 overlaps with the heat sink 132 in the view projected in the Z direction. The heat sink 134 is arranged to oppose the surface of the terminal 152 opposite to the semiconductor chip 112. The surface 134a of the heat sink 134 is electrically connected to the terminal 152 through the solder 25. The heat sink 134 has a heat radiation surface 134b opposite to the surface 134a. The heat radiation surface 134b exposes from the second surface 17b of the encapsulating resin body 17. The heat radiation surface 134b is substantially coplanar with the second surface 17b.

As shown in FIG. 3, the heat sink 134 has a joint portion 134c. The joint portion 134c has a thickness smaller than the other part (body part) of the heat sink 134. The joint portion 134c extends from one of side surfaces of the heat sink 134 toward the heat sink 133 and in the X direction. The joint portion 134c is offset from the joint portion 133c in the Y direction.

As shown in FIG. 3, the N terminal 142 is electrically connected to the joint portion 134c. The N terminal 142 extends in the Y direction and projects from the side surface 17c of the encapsulating resin body 17, which is the same side surface from which the P terminal 141 and the O terminal 143 project, to the outside of the encapsulating resin body 17. The projecting portions of the main terminals 14 (141, 142, 143) projecting from the encapsulating resin body 17 are located at substantially the same position with respect to the Z direction. Also, the projecting portions of the main terminals 14 (141, 142, 143) are arranged in the Y direction so that the N terminal 142 is located between the P terminal 141 and the O terminal 143.

The signal terminals 16 are electrically connected to the pads of the corresponding semiconductor chips 11 (111, 112) through the bonding wires 20. As shown in FIG. 2 and FIG. 3, the signal terminals 16 extend in the Y direction. The signal terminals 16 project to the outside of the encapsulating resin body 17 from a side surface 17d of the encapsulating resin body 17 opposite to the side surface 17c.

The encapsulating resin body 17 integrally encapsulates the semiconductor chips 11 (111, 112) having the electrodes 12, parts of the heat sinks 13 (131, 132, 133, 134), parts of the main terminals 14 (141, 142, 143), the terminals 15 (151, 152), and parts of the signal terminals 16. The encapsulating resin body 17 is, for example, made of an epoxy resin by a transfer molding method. As shown in FIG. 2, the encapsulating resin body 17 has the rectangular shape in the plan view. The P terminal 141, the N terminal 142, and the O terminal 143, which serve as the main terminals, extend outwardly from the side surface 17c of the encapsulating resin body 17, which is substantially parallel to the X direction. The signal terminals 16 extend outwardly from the side surface 17d of the encapsulating resin body 17 opposite to the side surface 17c.

The semiconductor device 10, which has the structure as described above, is so-called a "2 in 1 package" having the two semiconductor chips 11 in one package. The heat sinks 13 are located on opposite sides of each of the semiconductor chips 11 with respect to the Z direction. The heat of the semiconductor chips 11 can be dissipated from the opposite sides of each semiconductor chip 11. Specifically, in the upper arm, the heat sink 131, the solder 18, the semiconductor chip 111, the solder 21, the terminal 151, the solder 22, the heat sink 133 are arranged on top of another in this order from the first surface 17a of the encapsulating resin body 17 in the Z direction. In the lower arm, the heat sink 132, the solder 19, the semiconductor chip 112, the solder 24, the terminal 152, the solder 25 and the heat sink 134 are arranged on top of another in this order from the surface of the encapsulating resin body 17 in the Z direction. That is, the components are arranged in the same order in the Z direction between the upper arm and the lower arm.

Next, the main terminals 14 will be described with reference to FIG. 3 and FIG. 5.

In the following description, "width" indicates a dimension in a direction (X direction) that is perpendicular to a longitudinal direction (Y direction) of the main terminals 14 and perpendicular to a thickness direction (Z direction) of the main terminals 14. In FIG. 3, width-increased portions 141a, 143a are shown with hatchings so as to clarify formation areas.

Figure 5:
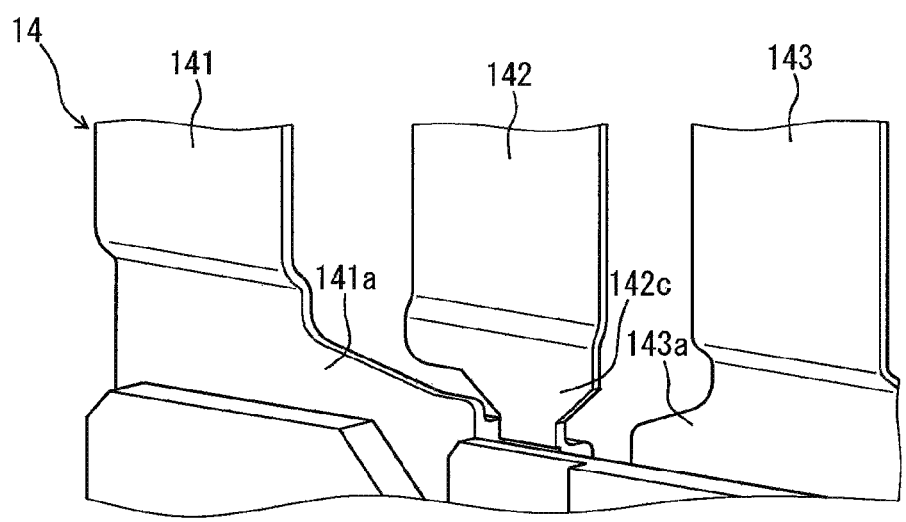
FIG. 5 is an enlarged view of a width-increased portion of a terminal of the semiconductor device according to the first embodiment.

As shown in FIG. 3 and FIG. 5, the P terminal 141 and the O terminal 143, which are located at opposite ends of three main terminals 14 arranged next to each other in the X direction, are correspondingly connected to the body portions of the heat sinks 13. It is to be noted that the body portion is a portion of the heat sink excluding the joint portions 132c, 133c, and 134c. That is, the body portion is the substantially rectangular portion of the heat sink. In particular, the P terminal 141 is connected to the body portion of the heat sink 131, and the O terminal 143 is connected to the body portion of the heat sink 132. The N terminal 142, which is located between the P terminal 141 and the O terminal 143, is connected to the joint portion 134c of the corresponding heat sink 134, instead of being connected to the body portion of the heat sink 134.

The P terminal 141 has a width-increased portion 141a in a predetermined area from the end connecting to the heat sink 131. Also, the O terminal 143 has a width-increased portion 143a in a predetermined area from the end connecting to the heat sink 132.

The width-increasing portion 141a has a first end 141a1 that defines a connection end connecting to the heat sink 131 in the Y direction, and a second end 141a2 opposite to the first end 141a1. In the present embodiment, the width of the second end 141a2 is the smallest width in the width-increased portion 141a. The width of the width-increased portion 141a increases toward the heat sink 131. That is, the width of the width-increased portion 141a increases from the second end 141a2 toward the first end 141a1, and is the maximum at the first end 141a1.

In the present embodiment, the width-increased portion 141a is located more to inside of the encapsulating resin body 17 than an encapsulated end portion 141b of the P terminal 141 that is located at the side surface 17c of the encapsulating resin body 17. That is, the width-increased portion 141a is formed at a position that is covered with the encapsulating resin body 17. A connecting portion 141c of the P terminal 141, which projects outside of the encapsulating resin body 17, is connected to a connection member (not shown), such as a bus bar. In the present embodiment, the P terminal 141 has a constant width from the second end 141a2 to the tip end of the connecting portion 141c. That is, the width of the encapsulated end portion 141b and the width of the connecting portion 141c are the same as the width of the second end 141a2 of the width-increased portion 141a.

Specifically, a side end of the width-increased portion 141a adjacent to the N terminal 142 in the X direction has a tapered shape. A side end of the width-increased portion 141a opposite to the N terminal 142 is straight in the Y direction and straightly connects the heat sink 131 and the connecting portion 141c. That is, the width-increased portion 141a has substantially a trapezoidal shape in a plan view. Thus, the width of the width-increased portion 141a gradually reduces from the body portion of the heat sink 131 toward the connecting portion 141c.

The width-increased portion 143a has substantially a similar structure to the width-increased portion 141a. The width-increased portion 143a has a first end 143a1 defining a connection end connecting to the heat sink 132 in the Y direction, and a second end 143a2 opposite to the first end 143a1. In the present embodiment, the width of the second end 143a2 is the smallest in the width-increased portion 143a. The width of the width-increased portion 141a increases toward the heat sink 131. That is, the width of the width-increased portion 143a increases from the second end 143a2 toward the first end 143a1, and is the maximum at the first end 143a1.

In the present embodiment, the width-increased portion 143a is located more to inside of the encapsulating resin body 17 than an encapsulated end portion 143b of the O terminal 143 that is located at the side surface 17c of the encapsulating resin body 17. That is, the width-increased portion 143a is formed at a position that is covered with the encapsulating resin body 17. A connecting portion 143c of the O terminal 143, which projects outside of the encapsulating resin body 17, is connected to a connection member (not shown), such as a bus bar. In the present embodiment, the O terminal 143 has a constant width from the second end 143a2 to the connecting portion 143c. That is, the width of the encapsulated end 143b and the width of the connecting portion 143c are the same as the width of the second end 143a2 of the width-increased portion 143a. The connecting portion 143c has substantially the same width as the connecting portion 141c.

Specifically, a side end of the width-increased portion 143a adjacent to the N terminal 142 in the X direction has a tapered shape. A side end of the width-increased portion opposite to the N terminal 142 also has a tapered shape. Thus, the width-increased portion 143a has substantially an isosceles trapezoid shape. Since the width-increased portion 143a has substantially the isosceles trapezoid shape in a plane shape, the width of the width-increased portion 143a gradually reduces from the body portion of the heat sink 132 toward the connecting portion 143c.

The N terminal 142 is connected to the joint 134c of the heat sink 134 through a solder (not shown), so that the N terminal 142 is connected to the heat sink 134. The N terminal 142 has a connecting portion 142a to be connected to the joint portion 134c. The connecting portion 142a has a constant width. The N terminal 142 is has a connecting portion 142b that is a portion projecting from the encapsulating resin body 17 and to which a connection member (not shown), such as a bus bar, is connected. The width of the connecting portion 142a is smaller than the width of the connecting portion 142b to ensure a clearance for insulation from each of the P terminal 141 and the O terminal 143, which are adjacent in the X direction.

The N terminal 142 has a width-increased portion 142c in a predetermined area from a connection end connecting to the connecting portion 142a. The width-increased portion 142c has a taper shape to ensure a clearance for insulation from each of the P terminal 141 and the O terminal 143. The tapered shape of the width-increased portion 142c is opposite to the tapered shape of the width-increased portions 141a, 143a of the P terminal 141 and the O terminal 143. That is, the width of the width-increased portion 142c is the smallest at the connection end connecting to the connecting portion 142a. The width of the width-increased portion 142c is larger at the end adjacent to the connecting portion 142b than that at the connection end connecting to the connecting portion 142a and is the maximum at the end adjacent to the connecting portion 142b.

In the present embodiment, the N terminal 142 has the width-increased portion 142c in an area that is covered with the encapsulating resin body 17, similar to the other width-increased portions 141a, 143a. In the present embodiment, the portion of the N terminal 142 from the end connecting to the width-increased portion 142a to a tip end of the connecting portion 142b has a constant width. The connecting portion 142b has substantially the same width as the connecting portions 141c and 143c.

Next, advantageous effects of the semiconductor device 10 described above will be descried.

In the present embodiment, of the main terminals 14, the P terminal 141 and the O terminal 143 have the width-increased portions 141a and 143a in the predetermined areas beginning from the connecting ends connecting to the corresponding heat sinks 13 (131, 132). Therefore, the portions adjacent to the ends 141a1, 143a1 of the P terminal 141 and the O terminal 143, that is, the base portions connecting to the heat sinks 13 are reinforced. As compared with a conventional structure in which the P terminal 141 and the O terminal 143 connect to the corresponding heat sinks 13 with the constant width, that is, without having the width-increased portions, vibrations of the P terminal 141 and the O terminal 143 due to vibrations transmitted from external devices through the connection members (e.g., bus bar) can be reduced.

Since the P terminal 141 and the O terminal 143 have the width-increased portions 141a, 143a, the change in width at the connecting portion connecting to the corresponding heat sinks can be smaller than that of the conventional structure. That is, the change in width of a current path is smaller than that of the conventional structure. As such, current concentration on the connecting portions of the P terminal 141 and the O terminal 143 connecting to the corresponding heat sinks 13 can be reduced. As described above, the current concentration can be reduced while restricting vibrations of the P terminal 141 and the O terminal 143. Since the vibrations of the P terminal 141 and the O terminals 143 can be reduced, separation occurring in the encapsulating resin body 17 due to the vibrations can be reduced.

The main terminals 14 having the width-increased portion at the base portions connecting to the corresponding heat sinks 13 are not limited to the example described above. Of the three main terminals 14, at least one terminal may have the width-increased portion. Alternatively, all the three main terminals 14 may have the width-increased portions. In the present embodiment, the P terminal 141 and the O terminal 143, which are arranged at the opposite ends of the three main terminals 14 arranged in the X direction, have the width-increased portions 141a, 143a. In such a case, the vibrations can be restricted at the opposite ends in the X direction, and the vibrations in the semiconductor device 10 can be reduced as compared with the case where only the N terminal 142 has the width-increased portion. The N terminal 142, which is located between the P terminal 141 and the O terminal 143, has the width-increased portion 142c with the tapered shape. The tapered shape of the width-increased portion 142c is different, that is, opposite to the tapered shape of the width increased portions 141c, 143c located on opposite sides. Therefore, an increase in size in the X direction can be restricted while keeping the clearance for insulation. Further, the width-increased portion 142c restricts the current concentration in the N terminal 142.

In the present embodiment, the width-increased portions 141a, 143a have the smallest widths at the second ends 141a2, 143a2. Therefore, as compared with the structure in which the width is the smallest at a part between the first ends 141a1, 143a1 and the second ends 141a2, 143a2, the current concentration can be effectively restricted. In particular, the width of the width-increased portion 141a, 143a increases toward the corresponding heat sinks 13 (131, 132). Since the width of the width-increased portions 141a, 143a gradually increases toward the corresponding heat sinks 13, the current concentration can be further effectively restricted. When the vibrations are externally transmitted to the P terminal 141 and the O terminal 143, it is less likely that the stress is concentrated to a part. Therefore, reliability in connection can further improve.

As the structure in which the width of the width-increased portions 141a, 143a is the smallest at the second ends 141a2, 143a2, it is not limited to the structure that the width of the width-increased portions 141a, 143a gradually increase toward the heat sinks 13. The width-increased portions 141a, 143a may have any other shape. For example, the width of the width-increased portions 141a, 143a may increase stepwise.

Second Embodiment

In the following description of a second embodiment, descriptions of portions similar to those of the semiconductor device 10 of the first embodiment will not be repeated.

Figure 6:
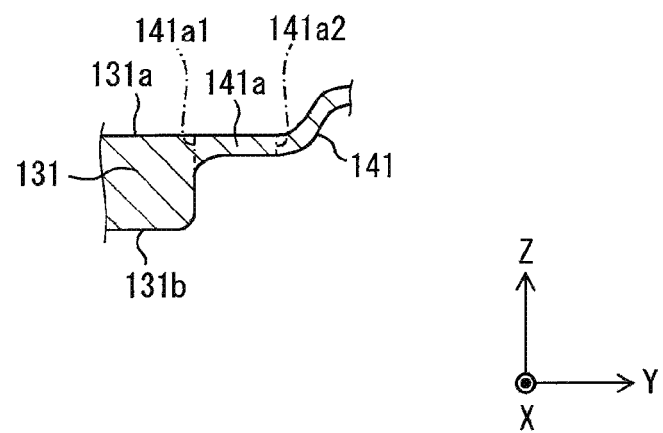
FIG. 6 is an enlarged cross-sectional view of a width-increased portion of a terminal of a semiconductor device according to a second embodiment of the present disclosure.

In the second embodiment, in addition to the structure of the first embodiment, the thickness of the first end 141a1, 143a1 of the P terminal 141 and the O terminal 143 adjacent to the heat sinks 13 is greater than the thickness of the second end 141a2, 143a2, and the thickness of the width-increased portions 11a, 143a is the maximum at the width-increased portions 141a, 143a. FIG. 6 is a cross-sectional view of the width-increased portion 141a taken along a line corresponding to a line VI-VI in FIG. 3.

As shown in FIG. 6, the thickness of the width-increased portion 141a is the maximum at the first end 141a1, and is the smallest at the second end 141a2. In the present embodiment, the thickness of the second end 141a2 is the same as the thickness of the connecting portion 141c. Further, of any two arbitrary positions between the first end 141a1 and the second end 141a2, the thickness of the one position adjacent to the first end 141a1 is equal to or greater than the other position adjacent to the second end 141a2. In the present embodiment, the thickness of a part in a predetermined range of the width-increased portion 141a beginning from the first end 141a1 increases toward the first end 141a1, and the thickness of a remaining part of the width-increased portion 141a is constant. Although not illustrated, the width-increased portion 143a has the similar thickness to the width-increased portion 141a.

In the present embodiment, the base portions of the P terminal 141 and the O terminal 143 are reinforced not only in the width direction but also in the thickness direction. Therefore, vibrations of the P terminal 141 and the O terminal 143 due to external vibrations transmitted through the connection members (e.g., bus bar) can be further effectively restricted.

The change in thickness of the connecting portions of the P terminal 141 and the O terminal 143 connecting to the corresponding heat sinks 13 is smaller than that of the conventional structure. Therefore, the change of thickness of the current path is smaller than that in the conventional structure. As such, the current concentration at the connecting portions of the P terminal 141 and the O terminal 143 connecting to the corresponding heat sinks 13 can be further effectively reduced.

Similar to the change of the width, the thickness of the width-increased portions 14 (141a, 143a) may be gradually increased toward the corresponding heat sinks 13 (131, 132). In the case where the thickness of the width-increased portions 141a, 143a is gradually increased toward the corresponding heat sinks 13, the current concentration can be further effectively restricted. When the vibrations are externally transmitted, the stress hardly concentrates to a point. Therefore, reliability in connection can be further improved.

In the embodiments described above, the width-increased portions 141a, 143a are entirely encapsulated in the encapsulating resin body 17. As another example, the width-increased portions 141a, 143a may be partly disposed outside of the encapsulating resin body 17. That is, the width-increased portions 141a, 143a may partly project from the side surface 17c of the encapsulating resin body 17. In such a case, the encapsulated ends 141b, 143b are located at parts on the tapered shapes.

The order of the arrangement of the main terminals 14 in the X direction is not particularly limited.

In the embodiments described above, the widths of the connecting portions 141c, 143c of the P terminal 141 and the O terminal 143 are exemplarily constant from the second ends 141a2, 143a2. That is, the widths of the width-increased portions 141a, 143a are exemplarily equal to or greater than the widths of the connecting portions 141c, 143c. As another example, the widths of the connecting portions 141c, 143c may be greater than the widths of the second ends 141a2, 143a2. As further another example, the widths of the connecting portions 141c, 143c may be greater than the widths of the width-increased portions 141a, 143a.

The structure of the semiconductor device 10 is not limited to the example described above. In the description hereinabove, the semiconductor device 10 has the upper and lower arm of one phase. As another example, the semiconductor device 10 may have the upper and lower arms of three phases. As further another example, the semiconductor device 10 may only have one of the upper arm and the lower arm, that is, may have only one semiconductor chip 11.

As the semiconductor device 10 of two-side heat radiation structure, it is not always necessary to have the terminals 15 (151, 152). The semiconductor device 10 of two-side heat radiation structure may not have the terminals 15 (151, 152).

In the embodiments described above, the heat sinks 13 are exemplarily disposed on opposite sides of the semiconductor chip 11. As another example, the semiconductor device 10 may have a one side heat radiation structure in which the heat sink 13 (metal member) is disposed only on one side of the semiconductor chip 11.

As the example of the metal member, the heat sinks 13 are employed. However, the metal member is not limited to the heat sinks 13, but may be any metal members that are electrically connected to the electrodes 12 of the semiconductor chips 11. It is not always necessary that the semiconductor device 10 has the encapsulating resin body 17.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A semiconductor device comprising:
a semiconductor chip having an electrode;
a metal member electrically connected to the electrode; and
a terminal extending from the metal member being connected to an external connection member, the terminal having a connecting portion being connected to the external connection member and a width-increased portion in a predetermined area beginning from a first end of the terminal connecting to the metal member, wherein
the connecting portion has a width smaller than a width of the metal member, and
the width-increased portion has a width that is greater than the width of the connecting portion and gradually increases from the width of the connecting portion to the width of the metal member toward the metal member.

2. The semiconductor device according to claim 1, wherein
the width-increased portion has a first end that defines the first end of the terminal and a second end opposite to the first end, and
the width-increased portion has a smallest width at the second end.

3. The semiconductor device according to claim 2, wherein
the second end connects to the connecting portion.

4. The semiconductor device according to claim 1, wherein
the first end of the width-increased portion has a thickness greater than that of a second end of the width-increased portion, the second end being opposite to the first end and adjacent to the connecting portion, and
the width-increased portion has a largest thickness at the first end.

5. The semiconductor device according to claim 1, further comprising:
an encapsulating resin body encapsulating the semiconductor chip, wherein
the connecting portion of the terminal projects outside of the encapsulating resin body from a side surface of the encapsulating resin body.

6. The semiconductor device according to claim 5, wherein
the first end of the width-increased portion is encapsulated in the encapsulating resin body, and
the width of the first end is greater than a width of the terminal at a position corresponding to the side surface of the encapsulating resin body.

7. The semiconductor device according to claim 5, wherein
the metal member is a heat sink electrically connected to the semiconductor chip,
a surface of the metal member opposite to the semiconductor chip is exposed from the encapsulating resin body,
the metal member and the terminal are made of a single member,
a thickness of the metal member is greater than a thickness of the terminal, and
a thickness of the width-increased portion gradually increases toward the metal member at the first end.

8. The semiconductor device according to claim 1, wherein
the width-increased portion is a reinforcement portion to reinforce the first end of the terminal connecting to the metal member.

9. The semiconductor device according to claim 1, wherein
the terminal having the width-increased portion that gradually increases from the connecting portion to the metal member includes at least two terminals that are separated from each other and that are each continuously attached to the metal member, the at least two terminals includes
a first terminal that includes a first width-increased portion directly attached to the metal member and a first constant-width portion that continuously extends from the first width-increased portion, the first constant-width portion is narrower than the first width-increased portion,
a second terminal that includes a second width-increased portion directly attached to the metal member and a second constant-width portion that continuously extends from the second-width increased portion, the second constant-width portion is narrower than the second width-increased portion; and
a third terminal that is different from the first terminal and the second terminal, that includes a width-narrowed portion continuously attached to the metal member at a position located between the first terminal and the second terminal, and that further includes a third constant-width portion that continuously extends from the width-narrowed portion, the third constant-width portion is wider, or equal to, the width-narrowed portion, the width-narrowed portion has a width that gradually decreases from the third constant-width portion to the metal member.

10. The semiconductor device according to claim 9, wherein
at least one side of each of the first width-increased portion of the first terminal, the second width-increased portion of the second terminal, and the width-narrowed portion of the third terminal is tapered.

11. The semiconductor device according to claim 10, wherein
two opposing sides of the width-narrowed portion of the third terminal are tapered in opposite directions from each other.

12. The semiconductor device according to claim 11, wherein
an inner side of the first width-increased portion of the first terminal that faces one of the two opposing sides of the width-narrowed portion tapers in a direction parallel to one of the two opposing sides closest to the inner side of the first width-increased portion.

13. The semiconductor device according to claim 12, wherein
an inner side of the second width-increased portion of the second terminal that faces one of the two opposing sides of the width-narrowed portion of the third terminal tapers in a direction parallel to one of the two opposing sides located closest to the inner side of the second width-increased portion.

14. The semiconductor according to claim 1, wherein
the terminal extending from the metal member continuously extends from the metal member.

15. A semiconductor device comprising:
a semiconductor chip having an electrode;

a metal member electrically connected to the electrode;
a terminal extending from the metal member being connected to an external connection member, the terminal having a width-increased portion in a predetermined area beginning from a first end of the terminal connecting to the metal member; and
an encapsulating resin body encapsulating the semiconductor chip, wherein
the terminal projects outside of the encapsulating resin body from a side surface of the encapsulating resin body,
the semiconductor chip includes a first semiconductor chip and a second semiconductor chip,
the first semiconductor chip and the second semiconductor chip are arranged in an arrangement direction that is perpendicular to a thickness direction of the first semiconductor chip and the second semiconductor chip,
each of the first semiconductor chip and the second semiconductor chip has the electrode on each of a first surface and a second surface opposite to the first surface in the thickness direction,
the metal member includes a first heat sink, a second heat sink, a third heat sink and a fourth heat sink,
the first heat sink is electrically connected to the electrode on the first surface of the first semiconductor chip,
the second heat sink is electrically connected to the electrode on the second surface of the second semiconductor chip,
the third heat sink is electrically connected to the electrode on the first surface of the second semiconductor chip and to the second heat sink, and
the fourth heat sink is electrically connected to the electrode on the second surface of the second semiconductor chip,
the semiconductor device comprising:
a first main terminal extending from the first heat sink;
a second main terminal extending from at least one of the second heat sink and the third heat sink; and
a third main terminal extending from the fourth heat sink, wherein
the first main terminal, the second main terminal and the third main terminal are arranged in the arrangement direction of the first and second semiconductor chips, and project to the outside of the encapsulating resin body from the side surface of the encapsulating resin body, and
two of the first to third terminals that are located at opposite ends in the arrangement direction are provided by the terminal having the width-increased portion.

16. A semiconductor device comprising:
a semiconductor chip having an electrode;
a metal member electrically connected to the electrode; and
a terminal extending from the metal member being connected to an external connection member, the terminal having a connecting portion being connected to the external connection member and a width-increased portion, wherein the connecting portion has a width smaller than a width of the metal member, and
the width-increased portion has a width that is greater than the width of the connecting portion and smaller than the width of the metal member, and gradually increases from the width of the connecting portion toward the metal member.

17. The semiconductor device according to claim 16, further comprising:
an encapsulating resin body encapsulating the semiconductor chip, wherein
the connecting portion of the terminal extends from the width-increase portion and projects outside of the encapsulating resin body from a side surface of the encapsulating resin body.

18. The semiconductor device according to claim 17, wherein
the semiconductor chip includes a first semiconductor chip and a second semiconductor chip,
the first semiconductor chip and the second semiconductor chip are arranged in an arrangement direction that is perpendicular to a thickness direction of the first semiconductor chip and the second semiconductor chip,
each of the first semiconductor chip and the second semiconductor chip has the respective electrode on each of a first surface and a second surface opposite to the first surface in the thickness direction,
the metal member includes a first heat sink, a second heat sink, a third heat sink and a fourth heat sink,
the first heat sink is electrically connected to the electrode on the first surface of the first semiconductor chip,
the second heat sink is electrically connected to the electrode on the second surface of the second semiconductor chip,
the third heat sink is electrically connected to the electrode on the first surface of the second semiconductor chip and to the second heat sink, and
the fourth heat sink is electrically connected to the electrode on the second surface of the second semiconductor chip,
the semiconductor device comprising:
a first main terminal extending from the first heat sink;
a second main terminal extending from at least one of the second heat sink and the third heat sink; and
a third main terminal extending from the fourth heat sink, wherein
the first main terminal, the second main terminal and the third main terminal are arranged in the arrangement direction of the first and second semiconductor chips, and project to the outside of the encapsulating resin body from the side surface of the encapsulating resin body, and
two of the first to third terminals that are located at opposite ends in the arrangement direction are provided by the terminal having the width-increased portion.

* * * * *